United States Patent
Cai et al.

(10) Patent No.: US 9,508,751 B2
(45) Date of Patent: Nov. 29, 2016

(54) ARRAY SUBSTRATE, METHOD FOR MANUFACTURING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhenfei Cai, Beijing (CN); Zhengwei Chen, Beijing (CN); Xingxing Song, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/742,107

(22) Filed: Jun. 17, 2015

(65) Prior Publication Data

US 2016/0064413 A1    Mar. 3, 2016

(30) Foreign Application Priority Data

Sep. 2, 2014  (CN) .......................... 2014 1 0443430

(51) Int. Cl.
*H01L 23/48* (2006.01)
*H01L 27/12* (2006.01)

(52) U.S. Cl.
CPC .......... *H01L 27/124* (2013.01); *H01L 2224/11* (2013.01)

(58) Field of Classification Search
CPC ...... H01L 27/12; H01L 29/66; H01L 29/786
USPC ........................................... 257/774; 438/283
See application file for complete search history.

(56) References Cited

U.S. PATENT DOCUMENTS 5,650,834 A * 7/1997 Nakagawa ........ G02F 1/136204
                                               349/139
5,841,490 A * 11/1998 Matsuo ............... H01L 27/1214
                                               257/E27.111

(Continued)

FOREIGN PATENT DOCUMENTS

CN          103474418 A      12/2013

OTHER PUBLICATIONS

First Chinese Office Action dated Sep. 5, 2016, for corresponding Chinese Application No. 201410443430.0.

*Primary Examiner* — Caleb Henry
(74) *Attorney, Agent, or Firm* — Kinney & Lange, P.A.

(57) ABSTRACT

The present invention provides an arrayed substrate, a method for manufacturing the same and a display device. It relates to a field of display technology. The short-circuit defect between the lead wires may be avoided while reducing a spacing between the adjacent two lead lines in a limited space for wiring. The array substrate comprises a plurality of criss-cross gate lines and data lines within a display area, and the array substrate further comprises a first short-circuiting ring and a second short-circuiting ring within a non-display area, and first data lead wires and second data lead wires connected electrically with the first short-circuiting ring and the second short-circuiting ring respectively; the first data lead wires are provided in the same layer and made from the same material as the gate lines for connecting electrically the first short-circuiting ring with first data lines of the data lines; the second data lead wires are provided in the same layer and made from the same material as the data lines for connecting electrically the second short-circuiting ring with second data lines of the data lines; wherein the first data lines are interleaved with the second data lines.

8 Claims, 5 Drawing Sheets

(56) References Cited

U.S. PATENT DOCUMENTS

| | | | |
|---|---|---|---|
| 6,734,925 B1* | 5/2004 | Lee | G02F 1/1345 349/40 |
| 2002/0021376 A1* | 2/2002 | Yoo | G02F 1/136204 349/40 |
| 2002/0089614 A1* | 7/2002 | Kim | G02F 1/1309 349/40 |
| 2003/0117536 A1* | 6/2003 | Jeon | G02F 1/136286 349/40 |
| 2003/0122976 A1* | 7/2003 | Choi | G02F 1/1309 349/40 |
| 2003/0197814 A1* | 10/2003 | Choi | G02F 1/136204 349/40 |
| 2004/0080480 A1* | 4/2004 | Zhang | G09G 3/3688 345/90 |
| 2004/0113881 A1* | 6/2004 | Kim | G02F 1/141 345/97 |
| 2005/0264503 A1* | 12/2005 | Wu | G09G 3/006 345/87 |
| 2006/0017373 A1* | 1/2006 | Lee | H01L 27/3288 313/500 |
| 2006/0033852 A1* | 2/2006 | Kim | G09G 3/3648 349/38 |
| 2006/0033857 A1* | 2/2006 | Kim | G02F 1/136204 349/54 |
| 2006/0098133 A1* | 5/2006 | Kwak | G02F 1/1309 349/54 |
| 2006/0145154 A1* | 7/2006 | Choi | G02F 1/13458 257/57 |
| 2006/0146274 A1* | 7/2006 | Youn | G02F 1/13458 349/192 |
| 2006/0192585 A1* | 8/2006 | Chen | G09G 3/006 324/760.01 |
| 2007/0002204 A1* | 1/2007 | Kim | G02F 1/1345 349/54 |
| 2007/0052896 A1* | 3/2007 | Eom | G02F 1/136259 349/139 |
| 2007/0109011 A1* | 5/2007 | Jun | G09G 3/006 324/760.02 |
| 2007/0131932 A1* | 6/2007 | Shin | H01L 27/0248 257/57 |
| 2007/0164289 A1* | 7/2007 | Jung | G02F 1/136204 257/72 |
| 2009/0284706 A1* | 11/2009 | Liu | G02F 1/1362 349/150 |
| 2009/0294771 A1* | 12/2009 | Kim | G02F 1/136204 257/59 |
| 2009/0296011 A1* | 12/2009 | Yoon | G02F 1/1362 349/40 |
| 2010/0059804 A1* | 3/2010 | Hayashi | H01L 27/14603 257/292 |
| 2010/0109993 A1* | 5/2010 | Chang | G02F 1/1345 345/92 |
| 2010/0110324 A1* | 5/2010 | Chang | G09G 3/006 349/54 |
| 2010/0127258 A1* | 5/2010 | Kang | G02F 1/13458 257/48 |
| 2010/0163884 A1* | 7/2010 | Chang | H01L 27/124 257/66 |
| 2010/0171507 A1* | 7/2010 | Hung | G09G 3/006 324/537 |
| 2010/0276604 A1* | 11/2010 | Okada | H01L 27/14603 250/370.09 |
| 2011/0095290 A1* | 4/2011 | Koo | G02F 1/1309 257/48 |
| 2011/0185322 A1* | 7/2011 | Young | G01R 31/2853 716/50 |
| 2011/0279746 A1* | 11/2011 | Kim | G02F 1/136259 349/54 |
| 2012/0025855 A1* | 2/2012 | Chang | G09G 3/006 324/750.3 |
| 2012/0056186 A1* | 3/2012 | Shirouzu | G02F 1/136204 257/59 |
| 2012/0169346 A1* | 7/2012 | Huang | G02F 1/1309 324/414 |
| 2013/0088679 A1* | 4/2013 | Lu | G09G 3/006 349/139 |
| 2013/0134986 A1* | 5/2013 | Yun | G09G 3/006 324/543 |
| 2013/0242215 A1* | 9/2013 | Chang | G02F 1/136204 349/41 |
| 2013/0265072 A1* | 10/2013 | Kim | G09G 3/006 324/754.01 |
| 2014/0139256 A1* | 5/2014 | Huang | G09G 3/006 324/760.02 |
| 2014/0160418 A1* | 6/2014 | Zhu | G02F 1/1333 349/139 |
| 2014/0306227 A1* | 10/2014 | Yu | H01L 27/124 257/72 |
| 2014/0375344 A1* | 12/2014 | Wang | G09G 3/006 324/750.3 |
| 2015/0115271 A1* | 4/2015 | Yoon | H01L 27/0255 257/72 |
| 2015/0146122 A1* | 5/2015 | Xu | G02F 1/136259 349/42 |
| 2015/0199929 A1* | 7/2015 | Kim | G09G 3/006 324/762.01 |
| 2015/0253579 A1* | 9/2015 | Kim | H04N 13/00 349/15 |
| 2016/0027372 A1* | 1/2016 | Yan | G02F 1/136204 345/211 |

* cited by examiner

ND DISPLAY DEVICE

ARRAY SUBSTRATE, METHOD FOR MANUFACTURING THE SAME AND DISPLAY DEVICE

CROSS-REFERENCE TO RELATED APPLICATION

This application claims the benefit of Chinese Patent Application No. 201410443430.0 filed on Sep. 2, 2014 in the State Intellectual Property Office of China, the whole disclosure of which is incorporated herein by reference.

BACKGROUND OF THE INVENTION

Field of the Invention

Embodiments of the present invention relates to the field of display technology, and in particular to an array substrate, a method for manufacturing the same and a display device.

Description of the Related Art

TFT-LCD (Thin Film Transistor-Liquid Crystal Display), as a flat panel display device, is increasingly applied in a high-performance display field because of its small size, low power consumption, no radiation and relatively low manufacturing cost and other characteristics.

A TFT-LCD device, as shown in FIG. 1a, includes an array substrate 10 and a color film substrate 20, a liquid crystal layer is provided between the array substrate 10 and the color film substrate 20. A desired display image is obtained by inputting a control signal into the array substrate 10 to control a deflection of liquid crystal layer in order to adjust a transmittance of light through the liquid crystal layer.

As shown in FIG. 1b, the array substrate 10 may comprise a plurality of data lines 101 arranged in a longitudinal sequence within a display area A. In order to detect defects such as a short-circuit defect which may appear during manufacturing the array substrate 10, lead wires 112 connected with the data lines 101 are provided in a peripheral area of the display area A (non-display area). A detecting signal is input into a data line 101 via the lead wire 112 to detect the short-circuit defect appearing in the data line 101. In order to simplify the manufacturing process and reduce a resistance between the lead wires 112 and the data lines 101, typically, the lead wire 112 may be formed from a material which forms a source-drain metal layer and the data lines 101.

Further, in order to simplify the manufacturing process, during manufacturing the above array substrate 10, a pattern of the data lines 101, a semi-conductor active layer 102, a source 103, a drain 104 and the lead wire 112 is generally formed through a single patterning process (comprising a single exposure process, an ashing process and several etching processes) with a mask having a semipermeable membrane. Since the mask having a semipermeable membrane is capable of forming photoresists with different thicknesses, the photoresist with larger thickness will also be ashed out in its edge when ashing the photoresist with smaller thickness and thinning the photoresist with larger thickness, so that a width of the data line 101 will be reduced. However, since the semi-conductor active layer is located below the source-drain metal layer constituting the data lines 101, the semi-conductor active layer at the edge of the data line pattern will be exposed when etching the source-drain metal layer corresponding the area where the photoresist has been ashed out. As a result, an exposed semi-conductor active layer is enlarged corresponding to the reduced width of the data line. Thus, in order to meet the development trend of a narrow bezel display device, when wiring the lead wires 112 in the non-display area with a small space, if employing the above manufacturing process with the mask having a semipermeable membrane, the formed lead wires 112 cannot be wired in the small space due to the limitation of its width, otherwise, a probability of occurrence of the short-circuit defect may be increased because two adjacent lead wires 112 are too close, resulting in an adverse effect on a quality of the display device.

SUMMARY OF THE INVENTION

Embodiments of the present invention provide an arrayed substrate, a method for manufacturing the same and a display device, by which the short-circuit defect between the lead wires may be avoided while reducing a spacing between the adjacent two lead lines in a limited space for wiring.

According to an aspect of the present invention, there is provided an array substrate, which comprises a plurality of criss-cross gate lines and data lines within a display area, a first short-circuiting ring and a second short-circuiting ring within a non-display area, and first data lead wires and second data lead wires connected electrically with the first short-circuiting ring and the second short-circuiting ring respectively;

the first data lead wires are provided in the same layer and made from the same material as the gate lines for connecting electrically the first short-circuiting ring with first data lines;

the second data lead wires are provided in the same layer and made from the same material as the data lines for connecting electrically the second short-circuiting ring with the second data lines;

wherein the first data lines are interleaved with the second data lines.

According to another aspect of the present invention, there is provided a display device comprising the above array substrate.

According to yet another aspect of the present invention, there is provided a method for manufacturing an array substrate, the method comprises:

forming a gate metal layer on a base substrate, and forming a pattern of gate lines and first data lead wires through a single patterning process;

forming a gate insulating layer, a semi-conductor active layer, a source-drain metal layer on the substrate on which the pattern of gate lines and first data lead wires having been formed, and forming a pattern of data lines and second data lead wires through a single patterning process;

the method further comprising: forming a first short-circuiting ring and a second short-circuiting ring in a non-display area;

wherein, the data lines comprise first data lines and second data lines interleaved with each other; and the method further comprising:

connecting electrically the first short-circuiting ring with the first data lead wires, and connecting electrically the first data lead wires with the first data lines;

connecting electrically the second short-circuiting ring with the second data lead wires.

With the arrayed substrate, the method for manufacturing the same and the display device according to embodiments of the present invention, the array substrate comprises a plurality of criss-cross gate lines and data lines within a display area, and the array substrate further comprises a first short-circuiting ring and a second short-circuiting ring within a non-display area, and first data lead wires and second data lead wires connected electrically with the first short-circuiting ring and the second short-circuiting ring respectively; the first data lead wires are provided in the same layer and made from the same material as the gate lines for connecting electrically the first short-circuiting ring with first data lines; the second data lead wires are provided in the same layer and made from the same material as the data lines for connecting electrically the second short-circuiting ring with second data lines; wherein the first data lines are interleaved with the second data lines. Since one (the first data lead wire) of the two adjacent data lead wires (first data lead wire and second data lead wire) is formed from the gate metal, and the adjacent first and second data lead wires are located in different film layers, as a result, the short-circuit defect between the lead wires may be avoided while reducing a spacing between the adjacent two lead lines (the first and second data lead wires) in a limited space for wiring so as to meet the development trend of a narrow bezel.

BRIEF DESCRIPTION OF THE DRAWINGS

In order to illustrate the technical solution of the prior art or embodiments of the present invention more clearly, a simply introduction about the drawings of the prior art or the embodiments will be made in the following, and obviously, the drawings described later relate to only some embodiments of the present invention. Other drawings will also be obtained by those skilled in the art without any creative effort according to these drawings.

LIST OF REFERENCE NUMERALS

01—base substrate; 10—array substrate; 101—data line; 1011—first data line; 1012—second data line; 102—semiconductor active layer; 103—source; 104—drain; 105—passivation layer; 106—gate; 107—gate insulating layer; 110—first short-circuiting ring; 111—second short-circuiting ring; 112—lead wire; 120—first data lead wire; 121—second data lead wire; 20—color film substrate; 200—connecting portion; 2001—first via hole; 2002—second via hole; 2003—connecting line; 30—transmitting terminal of detecting device; 31—receiving terminal of detecting device.

DETAILED DESCRIPTION OF PREFERRED EMBODIMENTS OF THE INVENTION

The embodiments of the present invention will be described clearly and completely hereinafter in conjunction with the drawings. Obviously, the followings are merely a part of, rather all of, the embodiments of the present invention. Based on the following embodiments, all the other embodiments obtained by those skilled in the art without any creative effort also fall in the scope of the present invention.

Figure 2A:
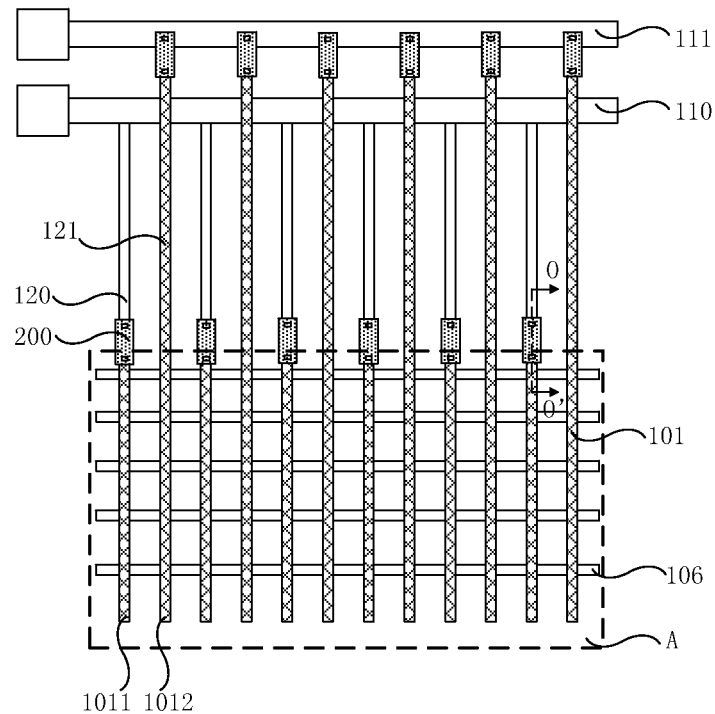
FIG. 2a is a structural schematic view of an array substrate according to an embodiment of the present invention.

An embodiment of the present invention provides an array substrate as shown in FIG. 2a. It may comprise a plurality of criss-cross gate lines 106 and data lines 101 within a display area A. It further comprises a first short-circuiting ring 110 and a second short-circuiting ring 111 within a non-display area (that is, a peripheral area of the above display area A), and first data lead wires 120 and second data lead wires 121 connected electrically with the first short-circuiting ring 110 and the second short-circuiting ring 111 respectively.

The first data lead wires 120 are provided in the same layer and made from the same material as the gate lines 106 for connecting electrically the first short-circuiting ring 110 with first data lines 1011 of the data lines 101.

The second data lead wires 121 are provided in the same layer and made from the same material as the data lines 101 for connecting electrically the second short-circuiting ring 111 with second data lines 1012 of the data lines 101.

The first data lines 1011 are interleaved with the second data lines 1012.

It should be noted that, firstly, in the embodiment of the present invention, as an example, the first data lines 1011 and the second data lines 1012 as shown in FIG. 2a represent odd columns of data lines and even columns of data lines respectively. The present invention is not limited to this. Of course, the first data lines 1011 and the second data lines 1012 may also represent even columns of data lines and odd columns of data lines respectively.

Secondly, the first short-circuiting ring 110 and the second short-circuiting ring 111 are used to transmit detecting signals to the first data lead wires 120 and the second data lead wires 121 respectively, so as to carry out a detection of the short-circuit defect on the first data lines 1011 connected with the first data lead wires 120 and the second data lines 1012 connected with the second data lead wires 121, respectively.

Figure 3:
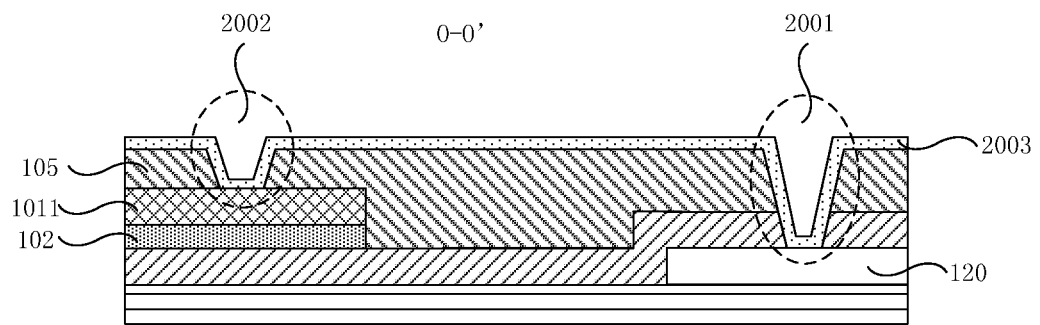
FIG. 3 is a partial structural schematic view of an array substrate according to an embodiment of the present invention.

Thirdly, since the first data lead wires 120 and the first data lines 1011 are provided in different layers, in order to connect electrically the first data lead wires 120 with the first data lines 1011, as shown in FIG. 3, in a case that a passivation layer 105 is provided above the substrate with the data lines 101 having been formed, the array substrate 10 may further comprise:

a first via hole 2001 located in the passivation layer 105 at a position corresponding to the first data lead wire 120;

a second via hole 2002 located in the passivation layer 105 at a position corresponding to the first data line 1011; and a connecting line 2003 located above the first and second via holes 2001, 2002 for connecting the first data lead wire 120 with the first data line 1011.

The first via hole 2001, the second via hole 2002 and the connecting line 2003 may form a connecting portion 200 as shown in FIG. 2a.

In order to simplify the manufacturing process, preferably, the connection line 2003 may be provided in the same layer and made from the same material as the transparent electrode layer in the array substrate. The transparent electrode layer may comprise a common electrode or a pixel electrode.

Specifically, for TN (Twist Nematic) type display devices, the connecting line 2003 may be provided in the same layer and made from the same material as the pixel electrode formed in the array substrate 10 because the common electrode is formed in the color film substrate 20.

For AD-SDS (Advanced-Super Dimensional Switching, referred to as ADS) type display devices, the common electrode and the pixel electrodes are both arranged in the array substrate. The common electrode and the pixel electrode may be provided in different layers, wherein, electrodes on an upper layer comprise a plurality of strip electrodes while electrodes on a lower layer comprise a plurality of strip electrodes or a plate-shaped electrode. Accordingly, the connecting line 2003 may be provided in the same layer and made from the same material as the electrodes on the upper layer.

For IPS (In Plane Switch, the transverse electric field effect) type display devices, a common electrode and a pixel electrode parallel to each other are arranged in the array substrate. Accordingly, the connecting line 2003 may be provided in the same layer and made from the same material as the common electrode or the pixel electrode.

Wherein, the material constituting the transparent electrode layer may include at least one of indium tin oxide or indium zinc oxide.

According to embodiments of the present invention, the array substrate comprises a plurality of criss-cross gate lines and data lines within a display area. The array substrate further comprises a first short-circuiting ring and a second short-circuiting ring within a non-display area, and first data lead wires and second data lead wires connected electrically with the first short-circuiting ring and the second short-circuiting ring respectively; the first data lead wires are provided in the same layer and made from the same material as the gate lines for connecting electrically the first short-circuiting ring with first data lines; the second data lead wires are provided in the same layer and made from the same material as the data lines for connecting electrically the second short-circuiting ring with second data lines. The first data lines are interleaved with the second data lines. Since one (the first data lead wire) of the two adjacent data lead wires connected with the data lines is formed from the gate metal, and the adjacent first and second data lead wires are located in different film layers, as a result, the short-circuit defect between the lead wires may be avoided while reducing a spacing between the adjacent two lead lines (the first and second data lead wires) in a limited space for wiring to meet the development trend of a narrow bezel.

Since the first short-circuiting ring 110 and the second short-circuiting ring 111 need to have a certain conductivity, they can be formed from a metal material. However, in the field of manufacturing a liquid crystal display, a common metal material includes a gate metal layer forming the gates 106 and a source-drain metal layer forming the data lines 101. Accordingly, in order to simplify the manufacturing process, the first short-circuiting ring 110 and the second short-circuiting ring 111 may be formed from the gate metal layer or the source-drain metal layer. Hereinafter, the material forming the first short-circuiting ring 110 and the second short-circuiting ring 111 is exemplarily illustrated.

(First Embodiment)

As shown in FIG. 2a, the first short-circuiting ring 110 and the second short-circuiting ring 111 may be provided in the same layer and made from the same material as the gate 106, that is, the first short-circuiting ring 110 and the second short-circuiting ring 111 are formed from the gate metal layer forming the gate 106. Since the second data lead wires 121 are formed from the source-drain metal layer and arranged in a different layer from the second short-circuiting ring 111 formed from the gate metal layer, an electrical connection between the second short-circuiting ring 111 and the second data lead wires 121 may be arranged in a similar way as the above connecting portion 200.

In addition, the first data lead wires 120 may be provided in the same layer and made from the same material as the first short-circuiting ring 110, accordingly, the first data lead wires 120 and the first short-circuiting ring 110 can be provided as an integral structure, that is, the first data lead wire 120 is connected with the first short-circuiting ring 110 directly.

(Second Embodiment)

Figure 2B:
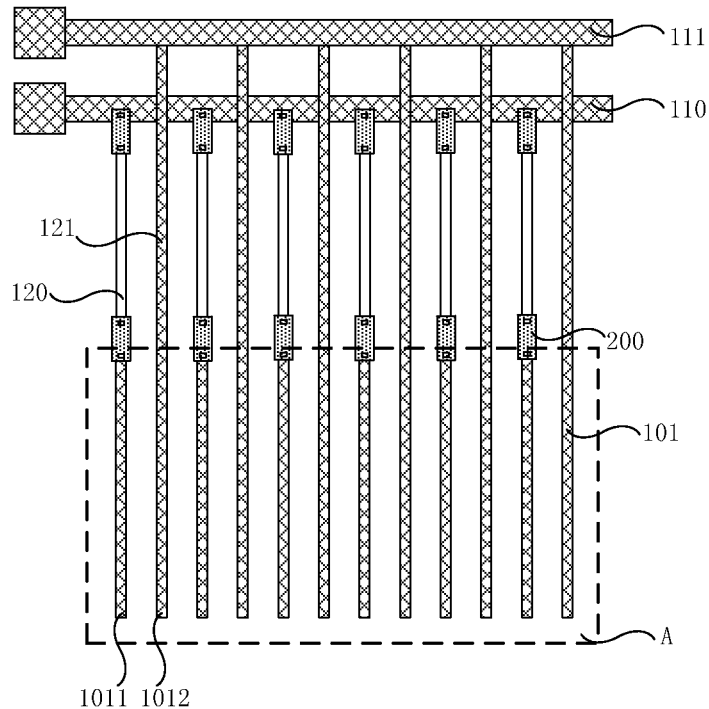
FIG. 2b is a structural schematic view of an array substrate according to another embodiment of the present invention.

As shown in FIG. 2b, the first short-circuiting ring 110 and the second short-circuiting ring 111 may be provided in the same layer and made from the same material as the data lines 101, that is, the first short-circuiting ring 110 and the second short-circuiting ring 111 are formed from the source-drain metal layer forming the data lines 101. Since the first data lead wires 120 are formed from the gate metal layer and arranged in a different layer from the first short-circuiting ring 110 formed from the source-drain metal layer, an electrical connection between the first short-circuiting ring 110 and the first data lead wires 120 may be arranged in a similar way as the above connecting portion 200.

In addition, the second data lead wires 121 may be provided in the same layer and made from the same material as the second short-circuiting ring 111, accordingly, the second data lead wires 121 and the second short-circuiting ring 111 can be provided as an integral structure, that is, the second data lead wire 121 is connected with the second short-circuiting ring 111 directly.

(Third Embodiment)

Figure 2C:
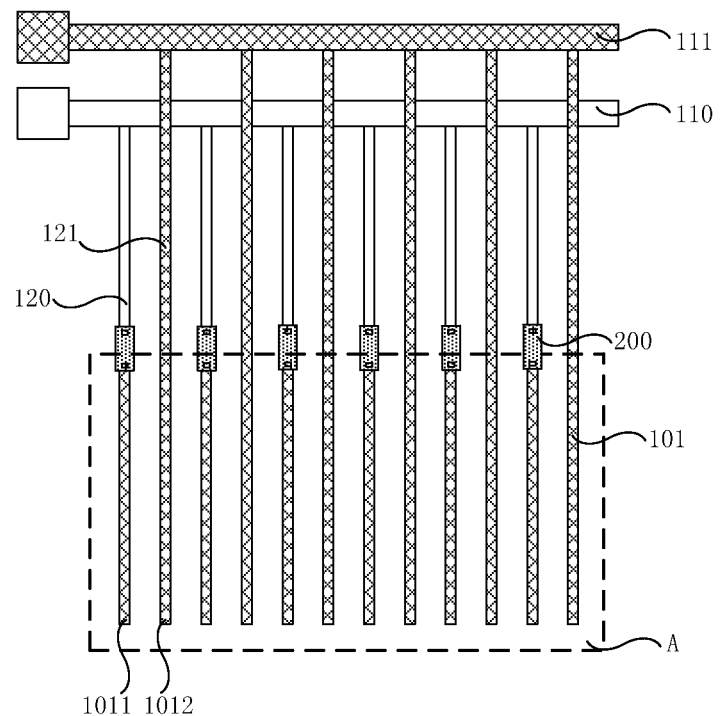
FIG. 2c is a structural schematic view of an array substrate according to a yet another embodiment of the present invention.

As shown in FIG. 2c, the first short-circuiting ring 110 is provided in the same layer and made from the same material as the gate lines 106 and the second short-circuiting ring 111 is provided in the same layer and made from the same material as the data lines 101. Since the first short-circuiting ring 110 is provided in the same layer and made from the same material as the first data lead wires 120, they can be provided as an integral structure. Since the second short-circuiting ring 111 is provided in the same layer and made from the same material as the second data lead wires 121, they can be provided as an integral structure.

Figure 4:
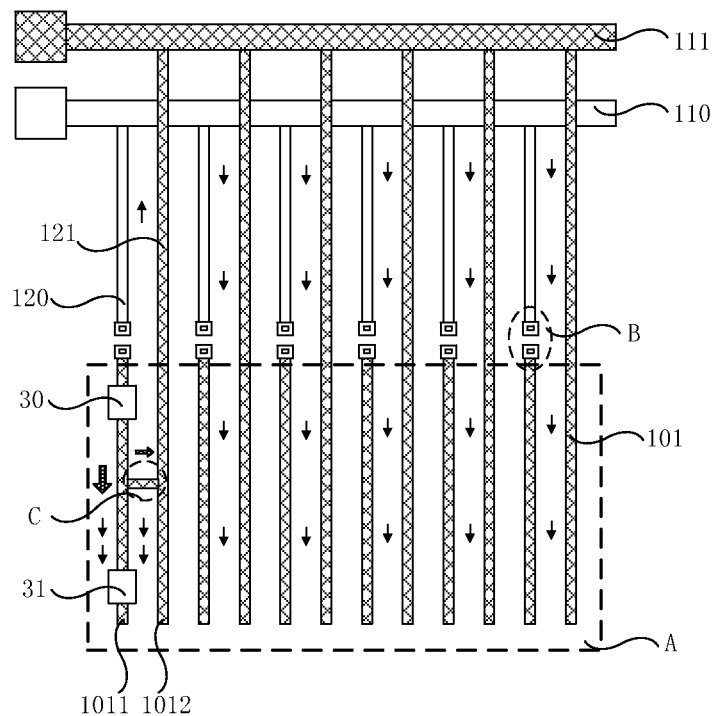
FIG. 4 is a schematic view showing a checking process for an array substrate according to an embodiment of the present invention.
Figure 5:
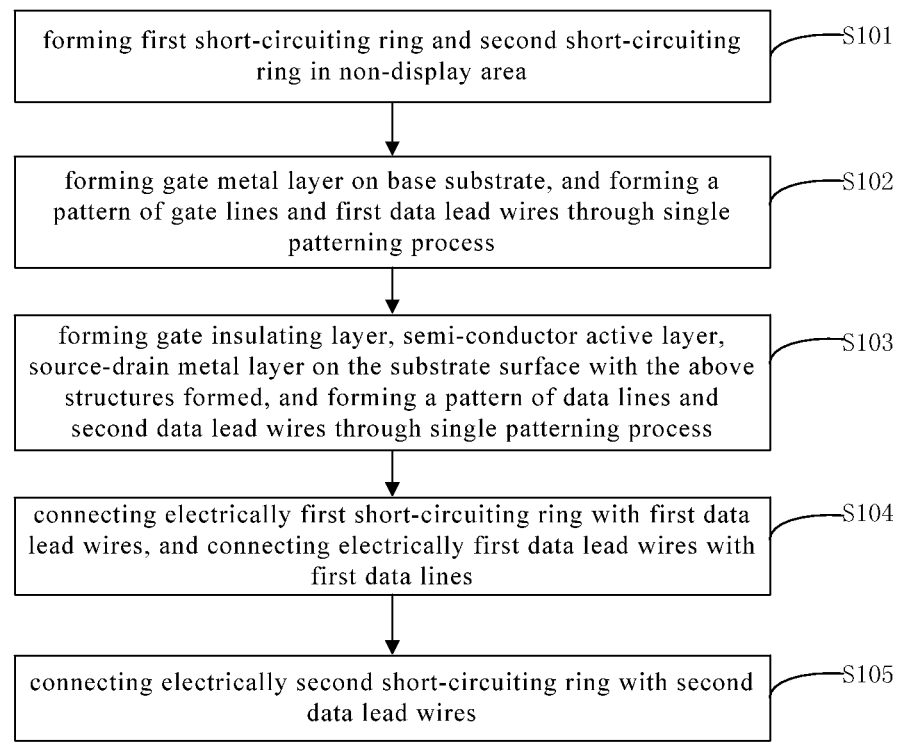
FIG. 5 is a flowchart for manufacturing an array substrate according to an embodiment of the present invention.

A detecting process may be conducted as shown in FIG. 4. Referring to FIG. 4, it can be seen that, because the short-circuit detection is carried out on the array substrate 10 with the data lines 101 thereon, the connecting line 2003 has not yet been provided at the electrical connecting portion B between the first data lead wire 120 and the first data lines 1011. A transmitting terminal 30 of a detecting device is disposed at one end of the first data line 1011 within the display area A while a receiving terminal 31 of detecting device is disposed at the other end of the first data line 1011. When the transmitting terminal 30 transmits a detecting signal, the detecting signal will pass through a short-circuit point C and be transferred to the second data line 1012 adjacent to it. Then, the detecting signal is transferred to the second short-circuiting ring 111 through the second data lead wire 121 integrally formed with the second data line 1012 and the second short-circuiting ring 111. Next, the detecting signal will be branched to all second data lines 1012 (that is, all even-numbered data lines 1012) through the second short-circuiting ring 111. As a result, since the signal transmitting from the transmitting terminal 30 is branched, the detecting signal is substantially attenuated, resulting in a voltage signal transferred to the receiving terminal 31 fluctuates, the short-circuit defect is thus detected.

In the first embodiment, when detecting the array substrate after the manufacture of data lines 101 is completed, since the second data lead wire 121 and the second short-circuiting ring 111 are disconnected and thereby the second data lines 1012 within the display area A cannot be electrically connected with each other, the detecting signal transmitting from the transmitting terminal 30 may not be branched through the second short-circuiting ring 111, resulting in the detection failure. Therefore, the detection of short-circuit defect must be performed on the array substrate provided by the first embodiment after the completion of entire manufacturing of array substrate.

In the second embodiment, although the second data lead wires 121, the second data lines 1012 and the second short-circuiting ring 111 are formed as an integral structure and thereby the detection of short-circuit defect may be performed after the completion of manufacturing of data lines 101, since an electrical connection using the connecting portion 200 is required between the first data lead wire 120 and the first short-circuiting ring 110, a resistance between the short-circuiting ring and the data lead wire is increased, reducing the transmission efficiency of detecting signal.

The third embodiment may be implemented as a preferred embodiment. In a case of reducing a spacing between the adjacent two lead lines in a limited space for wiring to meet the development trend of a narrow bezel, the array substrate according to the third embodiment can avoid the short-circuit defect between the lead wires. Moreover, the manufacturing process can be simplified, the resistance between the short-circuiting ring and the data lead wire is decreased, the transmission efficiency of detecting signal is improved. Also, the detection of short-circuit defect for the data lines 101 on the array substrate 10 can be performed either after the completion of entire manufacturing of array substrate 10 or after the completion of manufacturing of data lines 101. Thus, the defect can be detected as early as possible and it is helpful to increase a production yield and reduce manufacturing cost.

An embodiment of the present invention provides a display device comprising any of array substrates as described above. The display device has same beneficial effects as the array substrates in the above embodiments. The specific structures and the beneficial effects of the array substrate have been described in the above embodiments, thus they are not discussed here.

It should be noted that, in the embodiments of the present invention, the display device may include a liquid crystal display device, for example, the display device may be any product or component with display function such as a liquid crystal display (LCD), an LCD TV, a digital photo frame, a mobile phone or a tablet computer.

An embodiment of the present invention provides a method for manufacturing an array substrate, the method may include:

S101. forming a first short-circuiting ring 110 and a second short-circuiting ring 111 in a non-display area (a peripheral area out of the display area A).

Figure 1A:
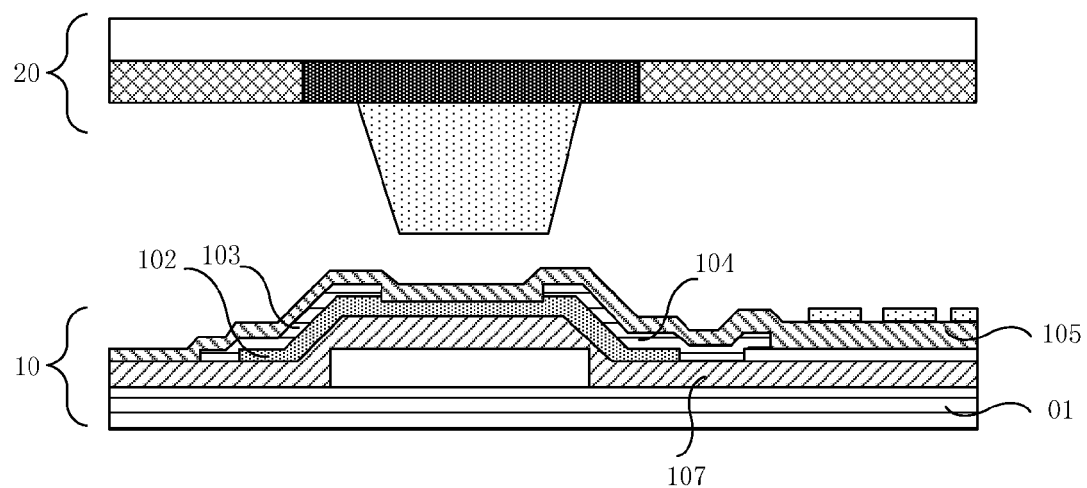
FIG. 1a is a structural schematic view of a display device in the prior art.
Figure 1B:
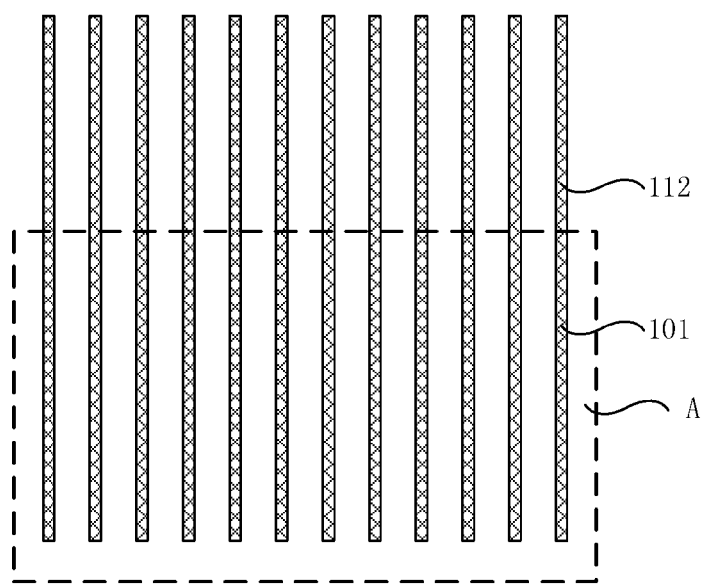
FIG. 1b is a structural schematic view of an array substrate in the prior art.

S102. as shown in FIG. 1a, forming a gate metal layer on a base substrate 01, and forming a pattern (as shown in FIG. 2a) of gate lines 106 and first data lead wires 120 through a single patterning process.

S103. forming a gate insulating layer 107, a semi-conductor active layer 102, a source-drain metal layer on the substrate with the above structures having been formed, and forming a pattern of data lines 101 (including the first data lines 1011 and the second data lines 1012) and a second data lead wire 121 through a single patterning process.

The first data lines 1011 and the second data lines 1012 are made to interleaved with each other.

S104. connecting electrically the first short-circuiting ring 110 with the first data lead wires 120, and connecting electrically the first data lead wires 120 with the first data lines 1011.

S105. connecting electrically the second short-circuiting ring 111 with the second data lead wires 121.

Figure 6:
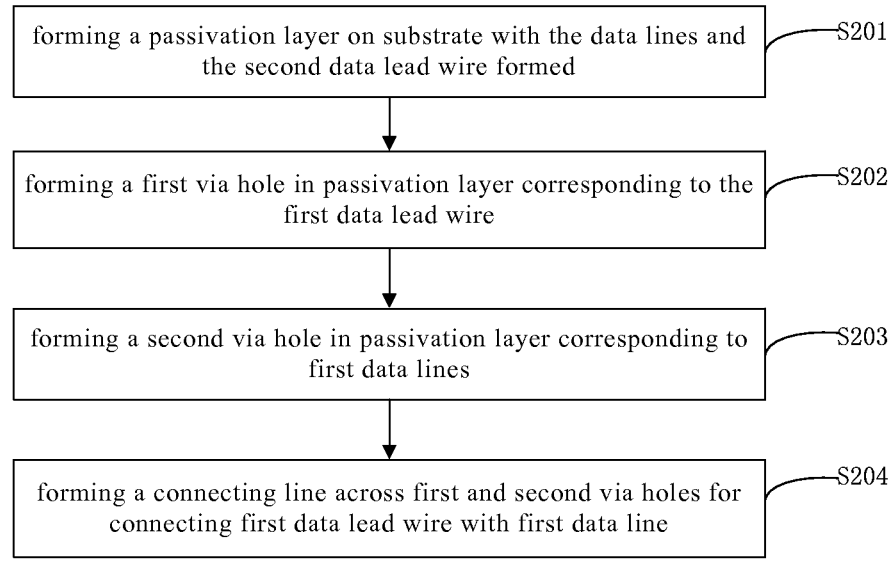
FIG. 6 is a flowchart for manufacturing another array substrate according to an embodiment of the present invention.

It should be noted that, as shown in FIG. 6, the connecting electrically the first data lead wires 120 with the first data lines 1011 may include:

S201. forming a passivation layer 105 on the substrate surface with the data lines 101 and the second data lead wires 121 having been formed.

S202. forming a first via hole 2001 in the passivation layer 105 at a position corresponding to the first data lead wire 120.

S203. forming a second via hole 2002 in the passivation layer 105 at a position corresponding to the first data lines 1011.

S204. forming a connecting line 2003 across the first and second via holes 2001, 2002 for connecting the first data lead wire 120 with the first data line 1001.

The first via hole 2001, the second via hole 2002 and the connecting line 2003 may form a connecting portion 200 as shown in FIG. 2a.

In order to simplify the manufacturing process, preferably, the connection line 2003 is provided in the same layer and made from the same material as the transparent electrode layer in the array substrate. Specifically, the transparent electrode layer is formed on the surface of passivation layer 105, and the connection line 2003 and the transparent electrode layer are formed through a single patterning process. The transparent electrode layer may include a common electrode or a pixel electrode. The material constituting the transparent electrode layer may include at least one of indium tin oxide or indium zinc oxide.

Embodiments of the present invention provide a method for manufacturing an array substrate. The method comprises: forming a first short-circuiting ring and a second short-circuiting ring in a non-display area; forming a gate metal layer on a base substrate, and forming a pattern of gate lines and first data lead wires through a single patterning process; forming a gate insulating layer, a semi-conductor active layer, a source-drain metal layer on the substrate with the above structures having been formed, and forming a pattern of data lines and second data lead wires through a single patterning process; wherein, the first data lines are interleaved with the second data lines; and then connecting electrically the first short-circuiting ring with the first data lead wires, and connecting electrically the first short-circuiting ring and the first data lines with the first data lead wires ; finally, connecting electrically the second short-circuiting ring with the second data lead wires, and connecting electrically the second short-circuiting ring and the second data lines through the second data lead wires. Since one (the first data lead wire) of the two adjacent data lead wires connected with the data lines is formed from the gate metal, and the adjacent first and second data lead wires are located in different film layers, as a result, the short-circuit defect between the lead wires may be avoided while reducing a spacing between the adjacent two lead lines (the first and second data lead wires) in a limited space for wiring to meet the development trend of a narrow bezel.

It should be noted that, in the present invention, the manufacturing in step S101 can be carried out during the step S102 or step S103.

Next, step S101 will be explained in detail exemplarily.

(Fourth Embodiment)

The above step S101 may include:

forming the gate metal layer on the base substrate 01, and forming a pattern of gate lines 106, the first data lead wires 120 and the first and second short-circuiting rings 110, 111 through a single patterning process. Since the second data lead wire 121 is formed from the source-drain metal layer and arranged in a different layer from the second short-circuiting ring 111 formed from the gate metal layer, the electrical connection between the second short-circuiting ring 111 and the second data lead wire 121 may be provided in a similar way as the above connecting portion 200.

In addition, the first data lead wires 120 may be provided in the same layer and made from the same material as the first short-circuiting ring 110, accordingly, the first data lead wires 120 and the first short-circuiting ring 110 can be provided as an integral structure, that is, the first data lead wires 120 are connected with the first short-circuiting ring 110 directly.

(Fifth Embodiment)

The above step S101 may include:

forming the gate insulating layer 107, the semi-conductor active layer 102, the source-drain metal layer on the substrate surface with the pattern of gate lines 106 and the first data lead wire 120 having been formed, and forming a pattern of data lines 101, the second data lead wires 121 and the first and second short-circuiting rings 110, 111 through a single patterning process. Since the first data lead wire 120 is formed from the gate metal layer and arranged in a different layer from the first short-circuiting ring 110 formed from the source-drain metal layer, the electrical connection between the first short-circuiting ring 110 and the first data lead wires 120 may be provided in a similar way as the above connecting portion 200.

In addition, the second data lead wires 121 may be provided in the same layer and made from the same material as the second short-circuiting ring 111, accordingly, the second data lead wires 121 and the second short-circuiting ring 111 can be provided as an integral structure, that is, the second data lead wires 121 are connected with the second short-circuiting ring 111.

(Sixth Embodiment)

Figure 7:
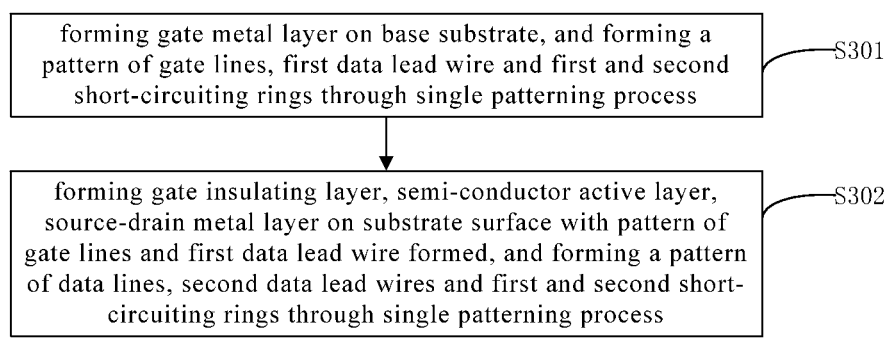
FIG. 7 is a flowchart for manufacturing yet another array substrate according to an embodiment of the present invention.

As shown in FIG. 7, the above step S101 may include:

S301. forming the gate metal layer on the base substrate 01, and forming a pattern of gate lines 106, the first data lead wires 120 and the first short-circuiting ring 110 through a single patterning process.

S302. forming the gate insulating layer 107, the semi-conductor active layer 102, the source-drain metal layer on the substrate surface with the above structures having been formed, and forming a pattern of data lines 101, the second data lead wires 121 and the second short-circuiting ring 111 through a single patterning process.

Since the first short-circuiting ring 110 is provided in the same layer and made from the same material as the first data lead wires 120, they can be provided as an integral structure. Since the second short-circuiting ring 111 is provided in the same layer and made from the same material as the second data lead wires 121, they can be provided as an integral structure.

Specifically, the detecting process may refer to FIG. 4. It can be seen that, because the short-circuit detection is carried out on the array substrate 10 with manufactured data lines 101, the connecting line 2003 has not yet provided at the electrical connecting portion B between the first data lead wire 120 and the first data line 1011. A transmitting terminal 30 of a detecting device is disposed at one end of the first data line 1011 within the display area A while a receiving terminal 31 of the detecting device is disposed at the other end of the first data line 1011. When the transmitting terminal 30 transmits a detecting signal, the detecting signal will pass through a short-circuit point C and be transferred to the second data line 1012 adjacent to it. Then, the detecting signal is transferred to the second short-circuiting ring 111 through the second data lead wire 121 integrally formed with the second data line 1012 and the second short-circuiting ring 111. Next, the detecting signal will be branched to all second data lines 1012 (that is, all even-numbered data lines 1012) through the second short-circuiting ring 111. As a result, since the signal transmitting from the transmitting terminal 30 is branched, the detecting signal is substantially attenuated, resulting in a voltage signal transferred to the receiving terminal 31 finally fluctuates, the short-circuit defect is thus detected.

In the fourth embodiment, when detecting the array substrate after the manufacture of data lines 101 are completed, since the second data lead wires 121 and the second short-circuiting ring 111 are not connected with each other and thereby the second data lines 1012 within the display area A cannot be electrically connected with each other, the detecting signal transmitting from the transmitting terminal 30 may not be branched through the second short-circuiting ring 111, resulting in the detection failure. Therefore, the detection of short-circuit defect must be performed after the completion of entire manufacturing of array substrate of the fourth embodiment.

In the fifth embodiment, although the second data lead wires 121, the second data lines 1012 and the second short-circuiting ring 111 are formed as an integral structure and thereby the detection of short-circuit defect may be performed after the completion of manufacturing of data lines 101, since an electrical connection using the connecting portion 200 is required between the first data lead wire 120 and the first short-circuiting ring 110, a resistance between the short-circuiting ring and the data lead wire is increased, reducing the transmission efficiency of detecting signal.

The sixth embodiment may be implemented as a preferred embodiment. In a case of reducing a spacing between the adjacent two lead lines in a limited space for wiring to meet the development trend of a narrow bezel, the array substrate according to the six embodiment can avoid the short-circuit defect between the lead wires. Moreover, the manufacturing process can be simplified, the resistance between the short-circuiting ring and the data lead wire is increased, the transmission efficiency of detecting signal is improved. Also, the detection of short-circuit defect for the data lines 101 on the array substrate 10 can be performed either after the completion of entire manufacturing of array substrate 10 or after the completion of manufacturing of data lines 101.

Thus, the defect can be detected as early as possible and it is helpful to increase production yield and reduce manufacturing cost.

The above are merely the specific implementations of the present invention. However, the scope of the present invention is not limited to this, any change or alternative readily envisaged by those skilled in the art may be also included in the scope of the present invention. Therefore, the scope of the present invention shall be defined in the claims.

What is claimed is:

1. An array substrate, comprising a plurality of criss-cross gate lines and data lines made up of first data lines and second data lines within a display area, wherein,
   the array substrate further comprises a first short-circuiting ring and a second short-circuiting ring within a non-display area, and first data lead wires and second data lead wires connected electrically with the first short-circuiting ring and the second short-circuiting ring respectively;
   the first data lead wires are provided in the same layer and made from the same material as the gate lines for connecting electrically the first short-circuiting ring with the first data lines;
   the second data lead wires are provided in the same layer and made from the same material as the data lines for connecting electrically the second short-circuiting ring with the second data lines;
   wherein the first data lines are interleaved with the second data lines.

2. The array substrate according to claim 1, wherein,
   the first short-circuiting ring is provided in the same layer and made from the same material as the gate lines;
   the second short-circuiting ring is provided in the same layer and made from the same material as the data lines.

3. The array substrate according to claim 1, wherein,
   the first and second short-circuiting ring are provided in the same layer and made from the same material as the gate lines; or
   the first and second short-circuiting ring are provided in the same layer and made from the same material as the data lines.

4. The array substrate according to claim 1, wherein, a passivation layer is provided above a base substrate with the data lines having been provided thereon, and the array substrate further comprises:
   a first via hole located in the passivation layer at a position corresponding to the first data lead wires;
   a second via hole located in the passivation layer at a position corresponding to the first data line; and
   a connecting line across the first and second via holes for connecting the first data lead wires with the first data line.

5. The array substrate according to claim 2, wherein, a passivation layer is provided above a base substrate with the data lines having been formed thereon, and the array substrate further comprises:
   a first via hole located in the passivation layer at a position corresponding to the first data lead wires;
   a second via hole located in the passivation layer at a position corresponding to the first data line; and
   a connecting line located across the first and second via holes for connecting the first data lead wires with the first data line.

6. The array substrate according to claim 3, wherein, a passivation layer is provided above the substrate surface with the data lines, and the array substrate further comprises:
   a first via hole located in the passivation layer at a position corresponding to the first data lead wires;
   a second via hole located in the passivation layer at a position corresponding to the first data line; and
   a connecting line across the first and second via holes for connecting the first data lead wires with the first data line.

7. The array substrate according to claim 4, further comprising a transparent electrode layer located on a surface of passivation layer, the connection line being provided in the same layer and made from the same material as the transparent electrode layer.

8. A display device, comprising the array substrate according to claim 1.

* * * * *